United States Patent [19]

Anthony et al.

[11] 3,895,967

[45] July 22, 1975

[54] SEMICONDUCTOR DEVICE PRODUCTION

[75] Inventors: Thomas R. Anthony; Harvey E. Cline, both of Schenectady, N.Y.

[73] Assignee: General Electric Company, Schenectady, N.Y.

[22] Filed: Oct. 30, 1973

[21] Appl. No.: 411,006

[52] U.S. Cl. ................ 148/1.5; 148/171; 148/172; 148/173; 148/186; 148/187; 148/188; 148/177; 148/179; 252/62.3 E; 252/62.3 GA

[51] Int. Cl. ............................................ Ho1l 7/34

[58] Field of Search ..... 148/1.5, 177, 179, 171–173, 148/186–189; 252/62.3 GA, 62.3 E

[56] References Cited

UNITED STATES PATENTS 2,813,048 11/1957 Pfann ..................................... 148/1

3,484,302 12/1969 Maeda et al. ........................ 148/1.5

*Primary Examiner*—G. Ozaki

*Attorney, Agent, or Firm*—Charles T. Watts; Joseph T. Cohen; Jerome C. Squillaro

[57] ABSTRACT

In the thermal gradient zone melting method of producing a semiconductor device by migrating an aluminum droplet through a silicon wafer, heat is continuously delivered uniformly to one side of the wafer through the use of a gas as a conduction medium and heat is continuously removed from the opposite side of the wafer through the use of the same gas principally as a convection medium.

3 Claims, 2 Drawing Figures

PATENTED JUL 22 1975 3,895,967

SEMICONDUCTOR DEVICE PRODUCTION

Figure 1:
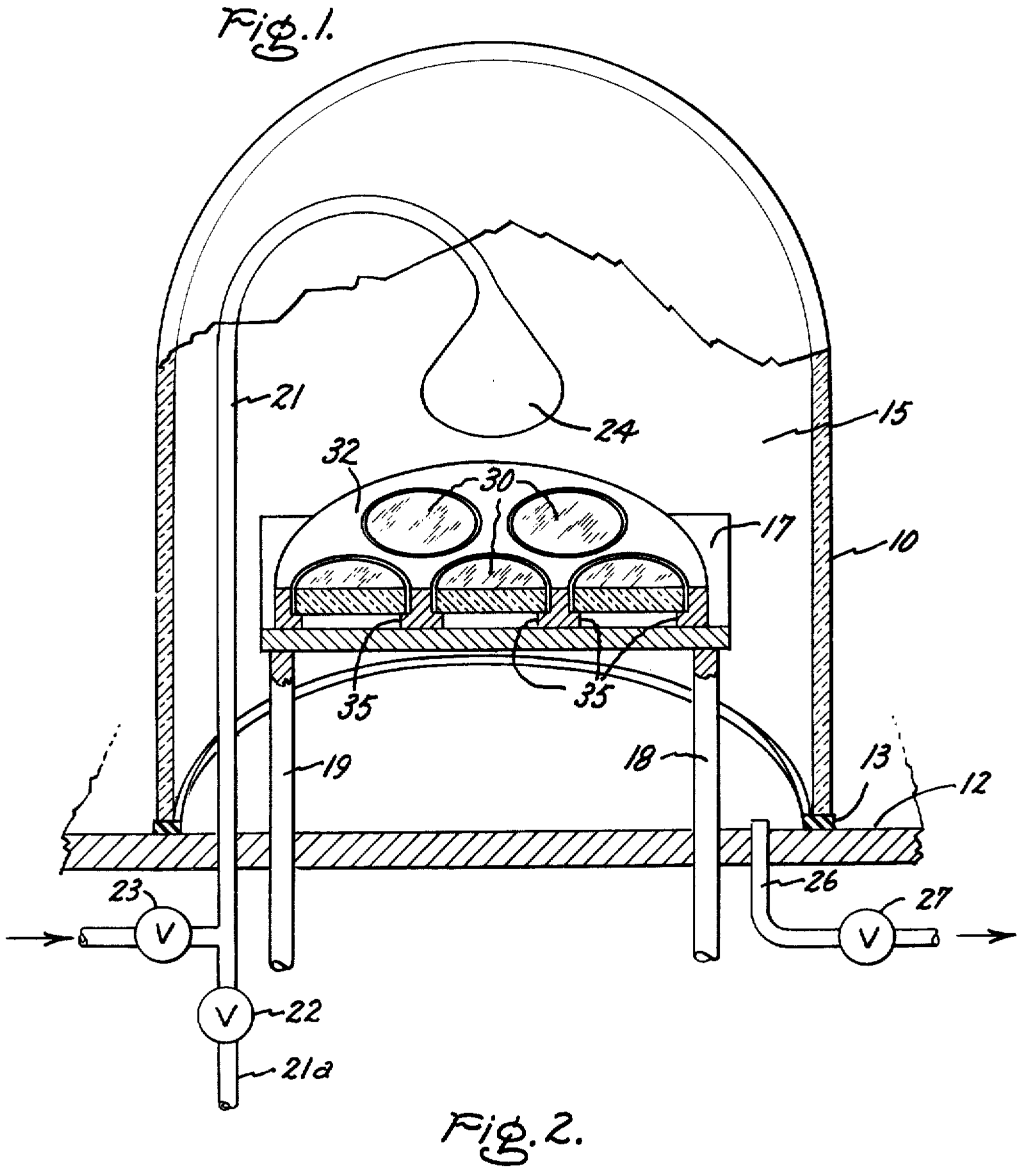

The present invention relates generally to the art of thermal gradient zone melting and is more particularly concerned with establishing and maintaining in the workpiece the desired conditions of maximum temperature and thermal gradient throughout the droplet thermomigration period.

BACKGROUND OF THE INVENTION

In accordance with prior art disclosures of the thermal gradient zone melting (TGZM) method of semiconductor production as exemplified by U.S. Pat. No. 2,813,048, issued Nov. 12, 1957 to W. G. Pfann, a workpiece in the form of a silicon wafer or the like is heated in a vacuum to melt the migrating droplet species and to maintain the desired thermal gradient through the workpiece. This imposes limitations both on the materials which can be used and on the manner in which the heating operation is carried out. In particular, semiconductors and dopants having high pressures at droplet migrating temperatures are as a practical matter disqualified for TGZM use. Also, the delivery of heat must be accomplished by radiation because conduction heating as by contact of the workpiece with another solid body results in considerable non-uniformity of heat distribution in the usual case of limited contact between the workpiece and the opposed surface of the heat source body.

It is accordingly a primary object of this invention to avoid or eliminate these limitations on the TGZM process.

It is another important object of this invention to achieve this substantial advance without incurring any significant loss or disadvantage in terms of either process efficiency and economy or product quality and value.

According to this invention, we have succeeded in these objectives by providing a means which is easy and economical to use and affords additional significant advantages over the previously-known TGZM practice. In essence, this invention centers in the new concept of using a special gas atmosphere instead of a vacuum to carry out the TGZM process, the gas being one or another or a mixture of several particular gases having high thermal conductivity. This atmosphere, then, serves to conduct heat from a heat source body to the workpiece with which it is also in heat-exchange contact. In the preferred practice of this invention, this gas atmosphere envelops the workpiece and is in heat-exchange contact with all exposed surface portions of it, and is also in heat-exchange contact with the walls of the vessel defining the TGZM process chamber. Consequently, this gas atmosphere also serves as a means of removing heat from the cold side of the workpiece by convection, this heat being released from the system as the gas flows in contact with the reaction vessel wall.

Figure 2:
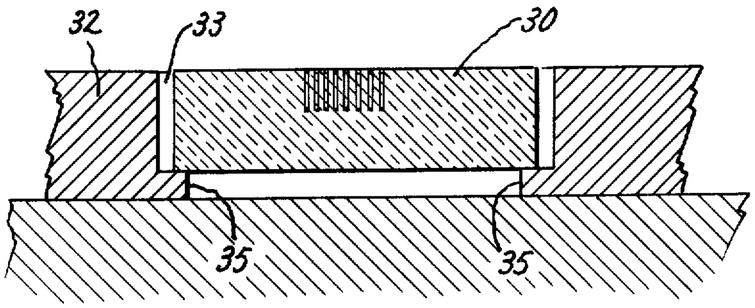

The new process concept of this invention is illustrated in the drawings accompanying and forming a part of this specification, in which:

FIG. 1 is an elevational view, partly in section, showing apparatus in which this invention method can be carried out in the production of semiconductor devices; and FIG. 2 is an enlarged, fragmentary, sectional view of a portion of the FIG. 1 apparatus showing the relationship between the workpiece and its support and the heat source body.

The consistent production of high-quality, high-performance semiconductor devices by thermomigration of metal droplets through ingots or wafers of semiconductor material requires special means and procedures as disclosed and claimed in our copending patent application Ser. No. 411,001, filed of even date herewith and assigned to the assignee hereof. In particular, the manner in which the heat is delivered to the workpiece or matrix crystal body of silicon or the like is critically important insofar as uniformity of heat delivery to and heat flow through that body are concerned. The manner of heat removal from the workpiece, also carried on continuously during the thermomigration process, is important in that it can have a bearing on the pattern of the heat flow in the workpiece and consequently on the trajectories followed by the migrating droplets used in the production of the deep diode-type of semiconductor device.

As shown in FIGS. 1 and 2, apparatus provided in accordance with this invention comprises a bell jar vessel 10 of suitable material such as brass supported on water-cooled copper base plate 12 as it rests on annular gas seal 13 on plate 12. Within chamber 15 provided by vessel 10, an electrical resistance heater 17 of graphite is supported above plate 12 and connected by copper electrodes 18 and 19 to a high voltage power source (not shown).

Gas is delivered into chamber 15 through line 21 as controlled by valve 22. The chamber can be evacuated through branch 21*a* which communicates with a pump (not shown) under control of valve 22. Gas enters chamber 15 through hood 24 directed downwardly toward heater 17.

Gases can be removed intermittently or continuously from chamber 15 during the thermomigration operation by means of exhaust pipe 26 as controlled by valve 27.

Workpieces 30 through which droplets are to be thermomigrated in accordance with our above-mentioned copending application Ser. No. 411,001 are supported on heater 17 by means of a tray 32. In the illustrated embodiment, workpieces 30 and tray 32 are all of silicon and the workpieces are disposed in the apertures 33 formed in the surface of tray 32 and rest on the annular rib 35 within each aperture with their upper surfaces flush with the top of the tray and with their lower surfaces exposed to a large extent through the lower ends of apertures 33.

In carrying out this process using the illustrated apparatus, the workpieces or ingots are suitably prepared in accordance with our invention disclosed and claimed in our copending patent application Ser. No. 411,150, filed of even date herewith and assigned to the assignee hereof. Then, with the workpieces positioned in the tray 30 as shown in FIGS. 1 and 2 with the source of metal droplets to be migrated disposed within the upper surface portion of each of the workpieces, chamber 15 is evacuated through line 21 and branch 21*a*, valves 23 and 27 being closed and valve 22 being open during this period. Valve 22 is closed when the pressure within chamber 15 has been reduced to about $3 \times 10^{-2}$ torr and the chamber is then filled and flushed with a gas, suitably helium, to be used in the thermomigration process, valve 27 being opened when the pressure in chamber 15 is about one atmosphere. The pressure within the chamber is maintained at about one atmosphere during the thermomigration period, which is then initiated by energizing heater 17. As the workpiece 30 is quickly brought to the operating temperature (the lower surface of workpieces 30 reaching 1200°C), thermomigration begins and proceeds as indicated in FIG. 2, the droplet source melting and the droplets migrating downwardly through each workpiece 30 in straight lines toward the highest temperature portion of the workpiece. As the heat is maintained, the helium gas between each workpiece 30 and heater 17 acts as a thermal conducting medium, delivering heat uniformly across the exposed surface of each workpiece. Any tendency for heat to radiate toward the central portion of any of the workpieces from supporting rib 35 is thereby prevented. At the same time, there is no tendency for heat loss to occur laterally from the sides of the workpiece, the opposed surface portions of tray 32 defining apertures 33 serving to prevent any such loss by radiation. Helium gas in the upper portion of the chamber contacts with the upper surface of each workpiece 30 and is in constant circulation as gas is continuously discharged into chamber 15 through hood 24. Thus, heat is removed continuously from workpieces 30 and by convection heat is delivered to vessel 10 so that the thermal differential required for thermomigration is maintained substantially constant through each workpiece 30 throughout the thermomigration process.

Gas pressure within chamber 15 will determine to a considerable extent the workpiece cooling effect under any given gas flow or circulation rate circumstance. In other words, gas pressure and convection heat transfer are directly related. Gas pressure, however, is not the important consideration insofar as gas thermal conduction is concerned, the maximum effect being ordinarily obtained at gas pressure of about one-tenth atmosphere and being slightly less at ten atmospheres. At substantially lower pressures, however, the gas thermal conduction effect diminishes sharply, being negligible at gas pressures on the order of $3 \times 10^{-2}$ torr.

As indicated above, a special benefit is to be gained by establishing and maintaining in chamber 15 a high thermal conductivity gas at a pressure of the order of more than one atmosphere and suitably up to ten atmospheres, particularly when semiconductors or dopants having high vapor pressures at the migrating temperature or at the preferred temperature of thermomigration process operation are involved.

As a specific and detailed example of the preferred practice of our invention, hydrogen was used as the atmosphere in chamber 15 as aluminum was thermomigrated through a silicon wafer. As the first step, a 1.6 mm thick wafer of 10 ohm-centimeters N-type silicon one inch in diameter was cut parallel to the (111) plane. The wafer was polished and a plurality of one-mil-deep grooves ten mils wide were etched into the surface using photolithography described in our copending patent application Ser. No. 411,150, filed of even date herewith and assigned to the assignee hereof. The recesses were filled with aluminum by electron beam evaporation. Excess aluminum on the surface of the wafer was ground off with 600 grit SiC paper.

An apparatus for containing the atmosphere and providing a thermal gradient was constructed. A 12-inch diameter water-cooled brass bell jar (like vessel 10) rested on water-cooled copper base plate 17. An O-ring seal made the container vacuum-tight, as described above. Four ¾-inch copper electrodes sealed to a ceramic provided the path into the chamber for bringing current to the graphite heating element. The heating element ¼ inch × 1 inch × 3 inches was clamped to two copper bus bars which were in turn clamped to the electrodes. A tantalum sheet heat shield was placed below the heating element to conserve power. The wafer was placed directly on the graphite element with the aluminum wires on the top.

The chamber was first evacuated and then six inches of mercury pressure of hydrogen introduced and the chamber was then sealed. About three volts of alternating current were needed to heat the sample to 1200°C. After four hours at temperature, the wafer was removed and on examination it was found that the aluminum migrated through the wafer to the bottom surface, and that the delivery of heat to the bottom surface of the wafer was uniform as evidenced by the straight-line courses followed by the migrating droplets all the way through the wafer. Thus, it was established that heat was conducted as effectively by the hydrogen in the spaces between points of contact of the wafer and the heater surface as by the solid bodies themselves.

While the thermal gradient in the workpiece was maintained at about 100°C per centimeter throughout the thermomigration period as the lower surface portion of the workpiece was maintained at 1200°C, it will be understood that a substantially greater thermal gradient could be established and maintained merely by continuously flowing the room-temperature hydrogen atmosphere into the chamber and through the chamber, thereby increasing the heat transfer from the upper surface of the workpiece to the atmosphere and the heat transfer from the atmosphere to the bell jar. In that case, some heat will also be removed from the system with the heated hydrogen withdrawn continuously through line 26 as the gas pressure in the chamber is maintained substantially constant.

In general, any gas which is not reactive with the workpiece and other components of the system in the thermomigration chamber under operating conditions may be used in accordance with this invention. It is our preference, however, to use a gas of high thermal conductivity, particularly hydrogen, helium or argon, suitably of dew point temperature about −70°C. Under certain circumstances, dopants may be added to or incorporated in the gas atmosphere to preserve the nature of the semiconductor workpiece surface during the thermomigration operation. Thus, for instance, nitrogen may be used as such a dopant or even as the gas atmosphere itself in certain cases. Generally, though, impurities such as gold, copper, iron, nickel and platinum, which can be detrimental to semiconductor properties, should be minimized.

It will be understood during the thermomigration operation described above, heat is transferred from hotter surfaces to cooler ones by radiation as, for example, in the case of the top surface of the workpiece from which heat is continuously lost by radiation. This effect, of course, is independent of the atmosphere in the chamber, but augments to a greater or lesser extent the heat transfer to and from the workpiece by the gas conduction and convection actions, depending upon the temperatures of the radiating surfaces.

As used herein, the term "droplets" means and includes small, individual drops as well as ordered arrays and lines, i.e., elongated droplets which on migrating produce a planar trail of recrystallized material instead of the column-like trail typical of the migrated small droplet.

Other materials than silicon in single crystal form may be used in this process, and metals other than aluminum may also be used as the migrating droplet source. Thus, germanium, gallium arsenide, gallium phosphide, silicon carbide or other semiconductor material in doped or undoped condition may be used instead of silicon. Likewise, gallium, tin, indium, gold and the like may be used in doped or undoped condition instead of aluminum. The latter material, however, must be one which has a melting point temperature below that of the matrix body and it must be one which on melting will form a solution with the matrix body of lower melting point temperature than that of the matrix body.

In the devices of this invention, the trails left by the migrating droplet are actually regions of recrystallized material extending part way or all the way through the semiconductor matrix body crystal. The conductivity and resistivity of the crystal and the recrystallized region in each instance will be different so that these trails or recrystallized regions will form with the matrix body crystal P-N junctions suitably of the step type if desired. Alternatively, they may serve instead as lead-throughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semiconductive material. It is a semiconductor material with maximum solid solubility of the impurity therein. Further, such recrystallized region has a constant uniform level of impurity concentration throughout the length of the region or trail and the thickness of the recrystallized region is substantially constant throughout its depth or length.

While in the foregoing examples it has been indicated that the aluminum source of migrating droplet material was deposited under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressure less than $3 \times 10^{-5}$ torr are used in this operation. Similarly, aluminum deposited by sputtering will by virtue of saturation be difficult to use in this process of ours so far as initiation of the droplet penetration action is concerned. It is our preference, accordingly, for an aluminum deposition procedure which prevents more than inconsequential amounts of oxygen from being trapped in the aluminum deposits.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain.

What we claim as new and desire to secure by Letters Patent of the United States is:

1. In the thermal gradient zone melting method of semiconductor device production including the steps of providing a deposit of a suitable metal in solid form as a migration droplet source within a first surface of a matrix body of semiconductor material, providing a heat source body to melt the deposited metal and cause the resulting droplet to migrate through the matrix body in the direction of a second surface of the matrix body, and placing the matrix body in juxtaposition to the heat source body, the combination of the step of providing a high heat conductivity gas at pressure between 0.1 and 10 atmospheres one portion of which is in heat exchange contact with the heat source and the second surface of the matrix body to deliver heat by conduction uniformly to the matrix body's second surface and the other portion of which is in heat exchange contact with the first surface of the matrix body and a relatively colder body to remove heat continuously from the matrix body.

2. The method of claim 1 in which the portion of the gas in heat-exchange contact with the said first surface removes heat by conduction from the matrix body.

3. The method of claim 1 in which the matrix body is disposed directly on the heat source body and the said gas is present in the spaces between points of contact of the matrix body with the heat source body.

* * * * *